United States Patent
Moon et al.

(10) Patent No.: US 10,680,046 B2
(45) Date of Patent: Jun. 9, 2020

(54) LUMINESCENT DISPLAY PANEL

(71) Applicant: LG DISPLAY CO., LTD., Seoul (KR)

(72) Inventors: Suhwan Moon, Paju-si (KR); Keeseok Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/129,260

(22) Filed: Sep. 12, 2018

(65) Prior Publication Data

US 2019/0081117 A1    Mar. 14, 2019

(30) Foreign Application Priority Data

Sep. 12, 2017 (KR) .................. 10-2017-0116424

(51) Int. Cl.
  *H01L 27/32* (2006.01)
  *H01L 51/00* (2006.01)
  *H01L 51/52* (2006.01)

(52) U.S. Cl.
  CPC ...... *H01L 27/3246* (2013.01); *H01L 27/3283* (2013.01); *H01L 51/0097* (2013.01); *H01L 51/5253* (2013.01); *H01L 51/5221* (2013.01); *H01L 2251/5338* (2013.01)

(58) Field of Classification Search
  None
  See application file for complete search history.

(56) References Cited

U.S. PATENT DOCUMENTS

| | | | |
|---|---|---|---|
| 9,960,216 B2 * | 5/2018 | Lee | .............. H01L 51/5212 |
| 2008/0218061 A1 | 9/2008 | Chao et al. | |
| 2009/0009069 A1 | 1/2009 | Takata | |
| 2014/0183479 A1 | 7/2014 | Park et al. | |
| 2016/0372528 A1 | 12/2016 | Kamura et al. | |
| 2017/0025486 A1 | 1/2017 | Kwon | |

FOREIGN PATENT DOCUMENTS

| | | |
|---|---|---|
| EP | 2998997 A1 | 3/2016 |
| EP | 3026725 A1 | 6/2016 |
| EP | 3291301 A1 | 3/2018 |

* cited by examiner

*Primary Examiner* — Michelle Mandala
(74) *Attorney, Agent, or Firm* — Birch, Stewart, Kolasch & Birch, LLP (57) ABSTRACT

A luminescent display panel having a structure improving an encapsulation capability is discussed. The luminescent display panel includes a first electrode positioned on a substrate, a bank overlapping at least a portion of the first electrode, a first body positioned on the bank, a second body positioned on the first body, a first organic layer positioned on the substrate and overlapping the first electrode and the bank, and a second electrode positioned on the substrate and overlapping the first electrode, the bank, and the first organic layer. The first body has a positive side slope, and the second body has a negative side slope.

9 Claims, 6 Drawing Sheets

LUMINESCENT DISPLAY PANEL

CROSS-REFERENCE TO RELATED APPLICATIONS

This application claims the priority benefit of Korean Patent Application No. 10-2017-0116424 filed in the Republic of Korea on Sep. 12, 2017, which is incorporated herein by reference into the present application for all purposes as if fully set forth herein.

BACKGROUND OF THE INVENTION

Field of the Invention

The present disclosure relates to a luminescent display panel, and more particularly to a luminescent display panel having a structure improving an encapsulation capability.

Discussion of the Related Art

Organic light emitting diode (OLED) displays including thin film transistors (TFTs) are generally attracting attention as display devices for mobile devices such as a digital camera, a video camera, a camcorder, a portable information terminal, and a smart phone.

Among the display devices for the mobile devices, flexible displays that are easy to carry and can be applied to display devices of various shapes, are recently under research and development as the next generation display device. Further, flexible displays based on an organic light emitting display technology have recently come into the spotlight.

When the flexible display is folded or wound, stress is accumulated on a thin film layer and can cause peeling of the thin film layer. In order to prevent the peeling, a structure, in which an organic layer is formed after a reverse spacer was formed, has been introduced. However, an encapsulation layer is not properly formed due to the structural characteristics of the reverse spacer.

SUMMARY OF THE INVENTION

Accordingly, an object of the present disclosure is to address the above-described and other problems associated with the related art and provide a luminescent display panel having a structure capable of increasing an adhesive strength between thin film layers formed inside a display panel and improving an encapsulation capability of an encapsulation layer.

In one aspect, there is provided a luminescent display panel comprising a first electrode positioned on a substrate, a bank overlapping at least a portion of the first electrode, a first body positioned on the bank, a second body positioned on the first body, a first organic layer positioned on the substrate and overlapping the first electrode and the bank, and a second electrode positioned on the substrate and overlapping the first electrode, the bank, and the first organic layer. The first body has a positive side slope, and the second body has a negative side slope.

In another aspect, there is provided a luminescent display panel comprising a thin film transistor on a substrate on which a plurality of subpixels is disposed, a first insulating layer disposed on the thin film transistor, an organic light emitting element passing through the first insulating layer and electrically connected to the thin film transistor, the organic light emitting element including a first electrode formed in each subpixel, an organic layer on the first electrode, and a second electrode on the organic layer, a second insulating layer covering an edge of the first electrode, the second insulating layer including a first opening exposing at least a portion of the first electrode, an encapsulation layer covering the organic light emitting element, and a multifunctional protrusion positioned on the first insulating layer and disposed in an organic layer broken portion in which the organic layer is not formed, wherein a side of the multifunctional protrusion includes a depressed portion.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such may mislead embodiments of the disclosure. Names of the respective elements used in the following description are selected only for convenience of writing the specification and may be thus different from those used in actual products.

When a structure is described as being positioned "on or above", "under or below", "next to" another structure, this description should be construed as including a case in which the structures directly contact each other as well as a case in which a third structure is disposed therebetween. On the other hand, when a structure is referred to as being "directly on" another structure, there is no intervening structure present.

Shapes, sizes, ratios, angles, number, and the like illustrated in the drawings for describing embodiments of the disclosure are merely exemplary, and the present disclosure is not limited thereto unless specified as such.

In the following description, an organic light emitting diode (OLED) display panel is described as an example for an easy understanding of embodiments of the disclosure. All the components of the OLED display panel according to all embodiments of the disclosure are operatively coupled and configured.

Figure 1:
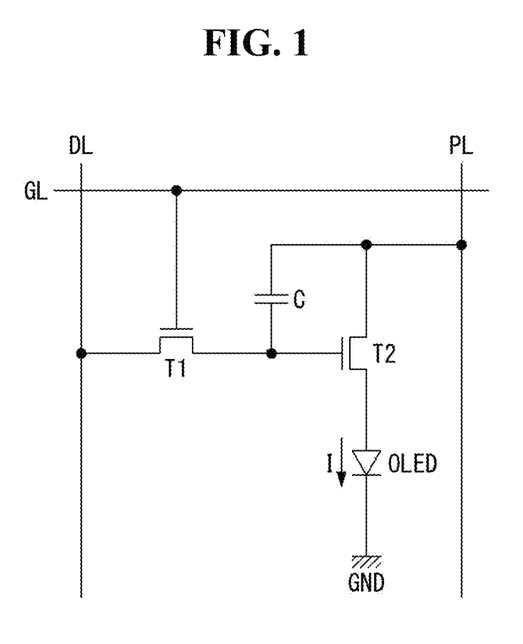
FIG. 1 is an equivalent circuit diagram of a pixel of a luminescent display panel according to an embodiment of the disclosure.

FIG. 1 is an equivalent circuit diagram of a pixel of an OLED display panel according to an embodiment of the disclosure. The pixel shown is an example and can have varied configurations/structures.

As shown in FIG. 1, each or at least one of the pixels of the OLED display panel according to the embodiment of the disclosure includes a switching thin film transistor T1 connected to a gate line GL and a data line DL, a driving thin film transistor T2 connected to the switching thin film transistor T1, a power line PL, and an organic electroluminescent cell, a storage capacitor C connected between the power line PL and a drain electrode of the switching thin film transistor T1, and an organic light emitting element OLED connected to the driving thin film transistor T2.

A gate electrode of the switching thin film transistor T1 is connected to the gate line GL, a source electrode of the switching thin film transistor T1 is connected to the data line DL, and the drain electrode of the switching thin film transistor T1 is connected to a gate electrode of the driving thin film transistor T2 and the storage capacitor C. A source electrode of the driving thin film transistor T2 is connected to the power line PL, and a drain electrode of the driving thin film transistor T2 is connected to the organic light emitting element OLED. The storage capacitor C is connected between the power line PL and the gate electrode of the driving thin film transistor T2.

When a scan pulse is supplied to the gate line GL, the switching thin film transistor T1 is turned on and supplies a data signal supplied to the data line DL to the storage capacitor C and the gate electrode of the driving thin film transistor T2. The driving thin film transistor T2 controls a current I, that is supplied to the organic light emitting element OLED from the power line PL, in response to the data signal supplied to the gate electrode of the driving thin film transistor T2, thereby adjusting an emission intensity of the organic light emitting element OLED. Even when the switching thin film transistor T1 is turned off, the driving thin film transistor T2 supplies the current I to the organic light emitting element OLED by a voltage charged to the storage capacitor C until the supply of the data signal is performed in a next frame. Hence, the driving thin film transistor T2 maintains the emission of the organic light emitting element OLED.

Figure 2:
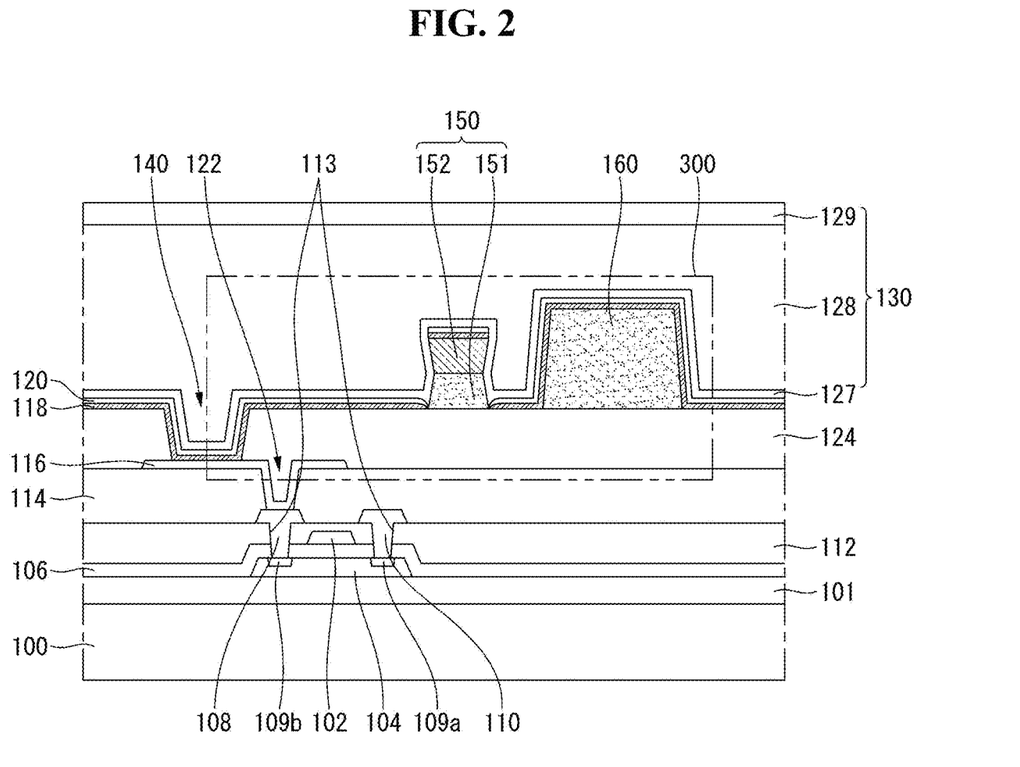
FIG. 2 is a cross-sectional view illustrating a structure of a luminescent display panel according to an embodiment of the disclosure.
Figure 3:
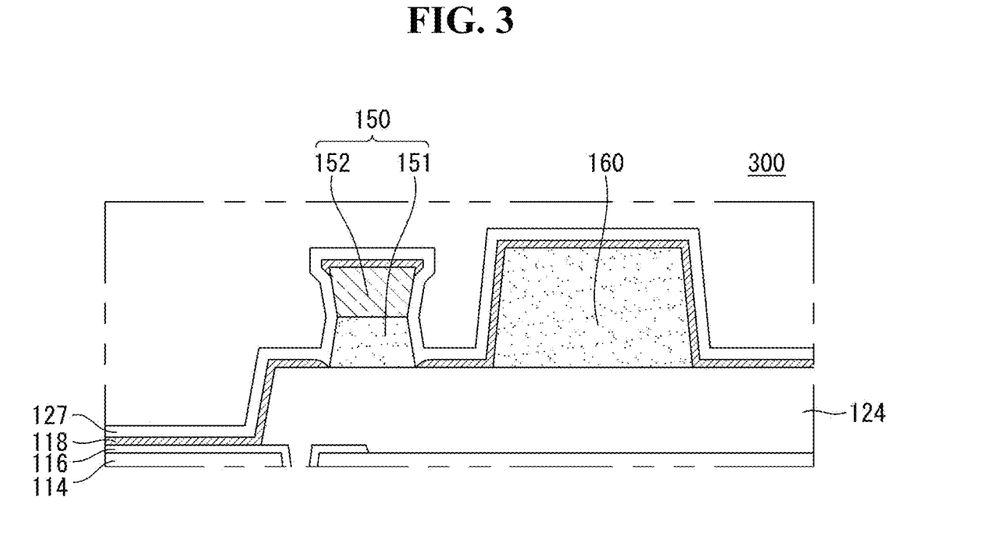
FIG. 3 is a cross-sectional enlarged view of an area 300 of the luminescent display panel according to an example of the disclosure.

FIGS. 2 and 3 are cross-sectional views illustrating a structure of the OLED display panel according to the embodiment of the disclosure. For example, FIGS. 2 and 3 show layer configurations of the OLED display of FIG. 1 including the pixel.

As shown in FIG. 2, the driving thin film transistor T2 is formed on a substrate 100 and a buffer layer 101. The driving thin film transistor T2 includes a semiconductor layer 104 having a source region 109a and a drain region 109b on both sides of the semiconductor layer 104, a gate insulating layer 106 covering the semiconductor layer 104, and a gate electrode 102 disposed on the gate insulating layer 106 at a location corresponding to the semiconductor layer 104. The driving thin film transistor T2 further includes a first protective layer 112, which covers the substrate 100 including the gate electrode 102 and includes contact holes 113 exposing the source region 109a and the drain region 109b positioned at ends of the semiconductor layer 104, and a source electrode 110 and a drain electrode 108 respectively connected to the source region 109a and the drain region 109b through the contact holes 113.

The OLED display panel includes a first electrode 116 positioned on the first protective layer 112, a second protective layer 114 covering the driving thin film transistor T2, a bank insulating layer 124 having an organic hole 140 exposing the first electrode 116, a first protrusion 150 and a second protrusion 160 positioned on the bank insulating layer 124, an organic layer 118 including a light emitting layer on the first electrode 116 exposed through the organic hole 140, and a second electrode 120 positioned on the organic layer 118.

The first protective layer 112 includes a contact hole 122 exposing the drain electrode 108 of the driving thin film transistor T2. The first electrode 116 is connected to the drain electrode 108 of the driving thin film transistor T2 through the contact hole 122.

The substrate 100 can be made of glass or polymer that has flexible characteristics. Thus, the OLED display panel according to the embodiment of the disclosure can be implemented as a flexible display panel or a foldable display panel.

The organic layer 118 can be divided into an electron injection layer EIL, an electron transport layer ETL, an emission layer EML, a hole transport layer HTL, and a hole injection layer HIL. The emission layer emits light of a specific wavelength while excitons produced by combining electrons from a cathode and holes from an anode return to a ground level.

When the first electrode 116 is a cathode, the second electrode 120 can be an anode. On the contrary, when the first electrode 116 is an anode, the second electrode 120 can be a cathode.

The first protrusion 150 can have a shape in which a center portion of a vertical cross section is depressed. Further, the first protrusion 150 can have a shape extended along one direction of the pixel or an island shape disposed between the pixels. The first protrusion 150 can include polyimide or novalac resin.

An encapsulation layer 130 is positioned on the second electrode 120. The encapsulation layer 130 has a structure in which at least one inorganic thin film layer 127 and 129 and at least one organic thin film layer 128 are alternately laminated. The encapsulation layer 130 entirely covers the organic layer 118, in order to block the organic layer 118, which is vulnerable to moisture, from the outside.

The organic layer 118 is not formed in at least a portion of the side of the first protrusion 150. Thus, the organic layer 118 on the bank insulating layer 124 is physically separated from the organic layer 118 on the first protrusion 150. Namely, continuity of the organic layer 118 on the substrate 100 is broken around the first protrusion 150.

FIG. 3 illustrates an enlarged view of an area/periphery 300 of the first protrusion 150 in the OLED display panel shown in FIG. 2 for an easy understanding of an embodiment of the disclosure.

Referring to FIG. 3, the first protrusion 150 and the second protrusion 160 are disposed on the bank insulating layer 124. In particular, the first protrusion 150 is disposed in an organic layer broken portion in which there is no organic layer 118. For example, the first protrusion 150 shown in FIG. 3 is disposed in the organic layer broken portion on the bank insulating layer 124. The first protrusion 150 and the second protrusion 160 do not need to be disposed adjacent to each other. FIG. 3 schematically illustrates an example structure of the first and second protrusions 150 and 160 for an easy understanding of an embodiment of the disclosure. For example, only one of the first and second protrusions 150 and 160 can be disposed between subpixels. It is preferable, but not required, that a height of the first protrusion 150 is less than a height of the second protrusion 160. Namely, a distance between an upper surface of the second protrusion 160 and the substrate 100 can be designed to be greater than a distance between an upper surface of the first protrusion 150 and the substrate 100.

The first protrusion 150 can include a first body 151 and a second body 152 on the first body 151. As shown in FIG. 3, the first body 151 has a positive side slope, and the second body 152 has a negative side slope. The first body 151 can be formed of polyimide, and the second body 152 can be formed of novalac resin.

More specifically, FIG. 3 illustrates that the side of the first body 151 and the side of the second body 152 each have one slope, by way of example. However, the side of the first body 151 and the side of the second body 152 can be curved and can have various slopes. In embodiments disclosed herein, the slope can indicate a maximum slope or an average slope of a side to be measured.

An upper surface of the first body 151 can protrude in a convex shape. The second body 152 can have a shape covering the protruding upper surface of the first body 151. Further, the second body 152 can be disposed on the first body 151 in a shape covering a portion of the side of the first body 151.

Referring to FIG. 3, the second protrusion 160 is disposed on the bank insulating layer 124. The second protrusion 160 can have a positive side slope and can be formed of the same material as the first body 151.

The organic layer 118 covers a side and an upper part of the bank insulating layer 124 exposed around the first electrode 116 and the organic hole 140. In this instance, the organic layer 118 is not formed in an overlap area of the first protrusion 150 and the bank insulating layer 124. The organic layer 118 can be disposed to cover the upper surface of the first protrusion 150 and the upper surface of the second protrusion 160. The organic layer 118 can be formed in at least a portion of the side of the first body 151.

The organic layer 118 is not formed in at least a portion of the side of the second body 152 having the negative side slope. Hence, the organic layer 118 is physically broken around the first protrusion 150. Namely, the continuity of the organic layer 118 is partially broken around the first protrusion 150.

The encapsulation layer 130 is formed on the organic layer 118. A first inorganic layer 127 of the encapsulation layer 130 is formed on the entire organic layer 118 and all the sides of the first protrusion 150. Namely, the first inorganic layer 127 covers both the sides of the first body 151 and the sides of the second body 152. Thus, the first inorganic layer 127 is formed in a display area without a physically broken portion. The first inorganic layer 127 or a second inorganic layer 129 can be formed by a chemical vapor deposition (CVD) method or an atomic layer deposition method.

Every time a flexible display panel is bent, stress is applied to each layer included in the OLED display panel. In particular, the organic layer 118 vulnerable to an adhesive strength can be peeled from the bank insulating layer 124 due to repeated stress.

In order to prevent the above-described problem, the first protrusion 150 having a negative side slope is disposed on the bank insulating layer 124. As described above, the first protrusion 150 breaks the continuity of the organic layer 118 and thus minimizes diffusion of a peeling phenomenon generated in a specific area. Further, the inorganic layers 127 and 129 are formed on the organic layer 118, in order to entirely cover the organic layer 118. Because the inorganic layers 127 and 129 each have a good adhesive strength, the inorganic layers 127 and 129 tightly adhere the organic layer 118 to the substrate 100.

The first inorganic layer 127 covers all the sides of the first protrusion 150. Namely, the first inorganic layer 127 is formed on the side of the second body 152 as well as the side of the first body 151. Hence, the first inorganic layer 127 have the good adhesive strength can tightly adhere the organic layer 118 to the substrate 100 by simultaneously covering the organic layer 118 and the sides of the first protrusion 150. As a result, the first inorganic layer 127 can tightly adhere the organic layer 118 to the substrate 100, so that the organic layer 118 underlying the encapsulation layer 130 is not peeled from the bank insulating layer 124.

The OLED display panel according to the embodiment of the disclosure can improve the adhesive strength of the organic layer 118 and prevent the peeling of the organic layer 118 in a folding area when a foldable display panel is implemented.

Figure 4:
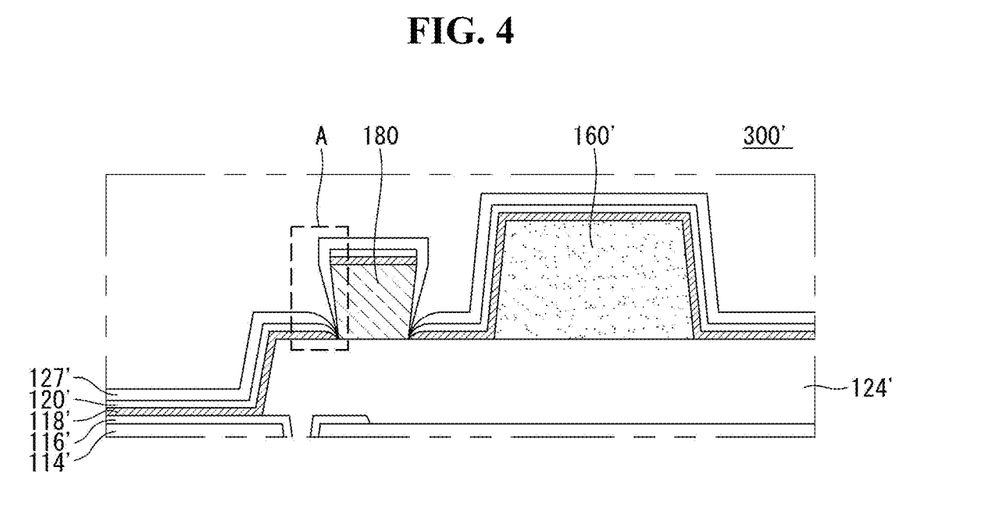
FIG. 4 is a cross-sectional view illustrating a structure of a luminescent display panel according to a comparative example.
Figure 5:
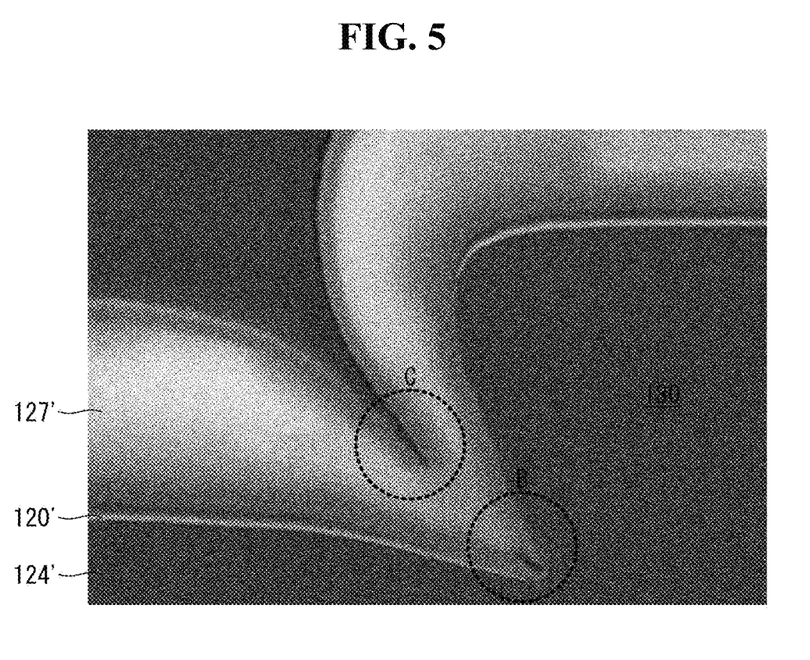
FIG. 5 is an enlarged view illustrating a portion A of FIG. 4.

FIG. 4 is a cross-sectional view illustrating a structure of a luminescent display panel according to a comparative example. FIG. 5 is an enlarged view illustrating a portion A of FIG. 4.

In the luminescent display panel shown in FIG. 4, a reverse spacer 180 having a negative side slope is directly disposed on a bank insulating layer 124'. Subsequently, an organic layer 118' and an inorganic layer 127' are sequentially disposed on a first electrode 116' exposed by an organic hole 140, the bank insulating layer 124', and the reverse spacer 180. The inorganic layer 127' is also formed on a side of the reverse spacer 180 having a negative side slope.

Referring to FIG. 5, the inorganic layer 127' cannot be formed in a portion of an area B where the reverse spacer 180 and the bank insulating layer 124' meet. As shown in the area B, the inorganic layer 127' includes a vacancy not including an inorganic material. The inorganic layer 127' in an area C can be thinner than the inorganic layer 127' in other areas. A space of the area B where the reverse spacer 180 and the bank insulating layer 124' meet is relatively narrower than spaces of other areas. In particular, in the areas B and C shown in FIG. 5, the reverse spacer 180 and the bank insulating layer 124' form an acute angle. In this case, a probability of diffusion of an inorganic material into the area B or C is further reduced in a process for depositing the inorganic layer 127'. Hence, the inorganic layer 127' can be deposited such that it does not have a uniform thickness or includes the vacancy as in the area B or C. As a result, the inorganic layer 127' shown in FIG. 4 has difficulty in efficiently sealing the organic layer 118'.

Referring to FIG. 3, the OLED display panel according to the embodiment of the disclosure includes the first protrusion 150 having the positive side slope on the bank insulating layer 124. The first body 151 having the positive side slope can increase an angle of a position where the first protrusion 150 and the bank insulating layer 124 meet, compared to the angle formed by the reverse spacer 180 and the bank insulating layer 124' according to the comparative example. Namely, because the side of the first body 151 and the bank insulating layer 124 form an obtuse angle, an inorganic material can be more easily diffused in a process for depositing the first inorganic layer 127. The above-described structure according to the embodiment of the disclosure can further improve an adhesion force between the encapsulation layer 130 and the bank insulating layer 124. In other words, because the embodiment of the disclosure sufficiently secures a space and an access path where the first protrusion 150 and the bank insulating layer 124 meet, the embodiment of the disclosure can uniformly deposit the inorganic material throughout the entire area.

The OLED display panel according to the embodiment of the disclosure includes the first protrusion 150 having both the positive side slope and the negative side slope. The first protrusion 150 includes the first body 151 having the positive side slope and the second body 152 having the negative side slope. The second body 152 is configured such that the organic layer 118 is not formed on the side of the second body 152, and thus partially breaks the continuity of the organic layer 118. The center portion of the vertical cross section of the first protrusion 150 is depressed in an engraved shape. Namely, the first protrusion 150 has a structure in which a portion having a gradually decreasing width and a portion having a gradually increasing width are successively disposed. Hence, the first protrusion 150 causes the inorganic material to be uniformly deposited in an area where the first body 151 and the second body 152 meet and an area where the first body 151 and the bank insulating layer 124 meet. Thus, the OLED display panel according to the embodiment of the disclosure can further increase the adhesive strength of the organic layer 118 and further improve a sealing capability of the encapsulation layer 130. As a result, the OLED display panel according to the embodiment of the disclosure is suitable for a display device such as a flexible display and a navigation device which require high reliability and high specifications.

Figure 6:
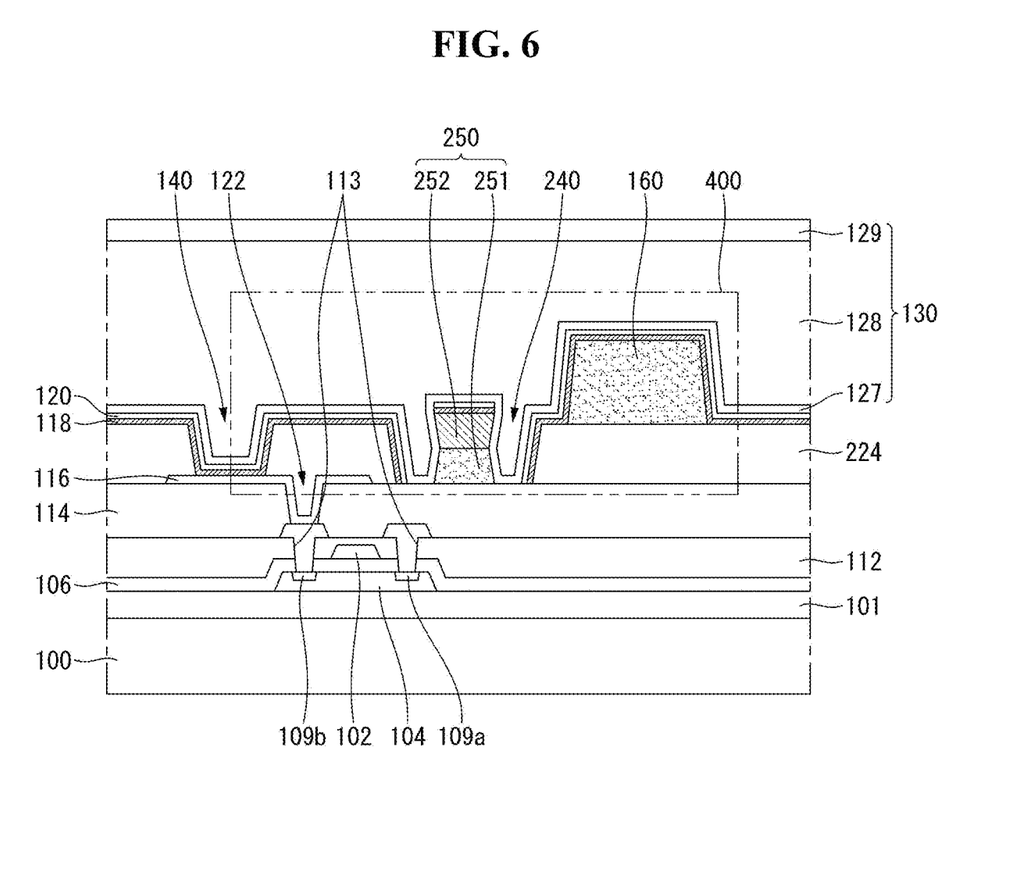
FIG. 6 is a cross-sectional view illustrating a structure of a luminescent display panel according to another embodiment of the disclosure.
Figure 7:
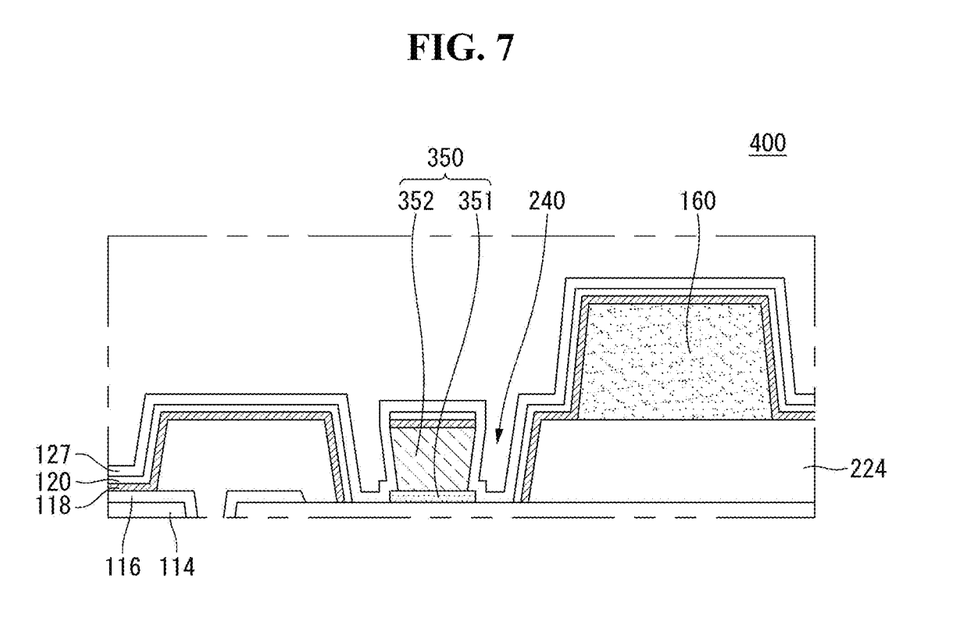
FIG. 7 is a cross-sectional enlarged view of an area 400 of the luminescent display panel according to an example of the disclosure.

FIG. 6 is cross-sectional views illustrating a structure of a luminescent display panel according to another embodiment of the disclosure. FIG. 7 illustrates an enlarged view of an area 400 shown in FIG. 6.

Referring to FIG. 6, a first protrusion 250 can be disposed in a bank hole 240. The bank hole 240 is an area, in which a bank insulating layer 224 is not formed, and exposes a second protective layer 114. The bank hole 240 includes an organic layer broken portion. The first protrusion 250 can be disposed in the organic layer broken portion on the second protective layer 114. A second protrusion 160 is disposed on the bank insulating layer 224. In this instance, it is preferable, but not required, that a protruding degree of the second protrusion 160 from a substrate 100 is greater than a protruding degree of the first protrusion 250 from the substrate 100.

An organic layer 118 can be disposed on a first electrode 116 and the first protrusion 250 as well as the bank insulating layer 224 having the hank hole 240 by which the second protective layer 114 is exposed. In particular, the organic layer 118 is formed on a side of the bank insulating layer 224 and a portion of a side of the first protrusion 250 having a positive side slope. However, the organic layer 118 is not formed in at least a portion of a side of the first protrusion 250 having a negative side slope.

The first protrusion 250 includes a first body 251 having a positive side slope. Because the side of the first protrusion 250 has the positive side slope, a first inorganic layer 127 can be uniformly formed on all the sides of the first protrusion 250 in a process for depositing the first inorganic layer 127. Namely, the first inorganic layer 127 can be successively formed on a side of the first body 251 and a side of a second body 252 without a broken portion. Further, because the first protrusion 250 includes both the first body 251 having the positive side slope and the second body 252 that is disposed on the first body 251 and has the negative side slope, a probability that bubbles are included in the first inorganic layer 127 formed around the first protrusion 250 can be minimized. Hence, the first inorganic layer 127 can tightly fix the organic layer 118 to the substrate 100 so that the organic layer 118 is not peeled.

Referring to FIG. 6, the second protective layer 114 of the bank hole 240 and the first protrusion 250 form an obtuse angle. Thus, a space for the inorganic layer is sufficient. Further, because an obtuse angle is formed at a position where the first body 251 and the second body 252 meet, the inorganic layer can be smoothly formed on the side of the first protrusion 250. Namely, because a space to form the inorganic layer is sufficiently opened inside the bank hole 240, there is no obstacle to diffusion of an inorganic material in a process for forming the first inorganic layer 127. Thus, the first inorganic layer 127 can be formed with a uniform thickness in a formation area of the organic layer 118 and can be also evenly formed in an area where the organic layer 118 is not formed. Hence, because the first inorganic layer 127 is successively formed without the broken portion in all areas where an encapsulation layer 130 is formed, the embodiment of the disclosure can secure better encapsulation capability. Further, the embodiment of the disclosure can minimize the peeling of the organic layer 118 by tightly fixing the organic layer 118 to the substrate 100.

Referring to FIG. 7, a first protrusion 350 according to another embodiment of the disclosure is disposed on a second protective layer 114 of a bank hole 240. Namely, the first protrusion 350 is disposed on an organic layer broken portion not having an organic layer.

The first protrusion 350 includes a first body 351 and a second body 352 that is positioned on the first body 351 and has a negative side slope. The first body 351 can include the same material as a first electrode 116, and the first body 351 and the first electrode 116 can be formed at the same time through the same process. Thus, because the first body 351 is formed without a separate mask, process time and process cost can be saved. Other materials can be used for the first body 351. For example, the first body 351 can include a different material from the first electrode 116.

The first protrusion 350 according to another embodiment of the disclosure has an acute angle. Referring to FIG. 7, an upper surface of the first body 351 and a side of the second body 352 form an acute angle. A portion ranging from the second protective layer 114 to the second body 352 via the side and the upper surface of the first body 351 has a stepped shape due to a formation of the first body 351, and thus a space to deposit an inorganic material can be secured. Hence, a first inorganic layer 127 can be uniformly deposited in all of spaces of the bank hole 240 including the first protrusion 350.

As described above, the OLED display panel according to the embodiments of the disclosure includes the protrusion having the negative side slope and thus can prevent the peeling of the organic layer. Further, the OLED display panel according to the embodiments of the disclosure includes the protrusion having the positive side slope and thus can improve the encapsulation capacity of the encapsulation layer.

Although the embodiments have been described with reference to a number of illustrative embodiments thereof, numerous other modifications and embodiments can be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A luminescent display panel comprising:
   a first electrode positioned on a substrate;
   a bank covering at least a portion of the first electrode;
   a first body positioned on the bank;
   a second body positioned on the first body;
   a first organic layer positioned on the substrate and overlapping the first electrode and the bank;
   a second electrode positioned on the substrate and overlapping the first electrode, the bank, and the first organic layer;
   an inorganic insulation layer covering the first organic layer and contacting with sides of the first and second bodies exposed from the first organic layer; and
   a second organic layer between the second body and the inorganic insulation layer,
   wherein the first body has a positive side slope, and the second body has a negative side slope, and
   wherein the second organic layer includes an area spaced from the first organic layer.

2. The luminescent display panel of claim 1, wherein as the second body goes from a first surface contacting the first body to a second surface opposite the first surface in a vertical direction, a cross-sectional area of the second body increases, and
   wherein as the first body goes from a third surface contacting the second body to a fourth surface that is closer to the substrate than the third surface, a cross-sectional area of the first body increases.

3. The luminescent display panel of claim 1, further comprising a third body positioned on the bank and not overlapping the first body and the second body,
   wherein the third body has a positive side slope.

4. The luminescent display panel of claim 3, wherein the first body includes a different material from the second body.

5. The luminescent display panel of claim 3, wherein a maximum separation distance between an upper surface of the third body and the substrate is greater than a maximum separation distance between an upper surface of the second body and the substrate.

6. The luminescent display panel of claim 1, wherein the inorganic insulation layer covers all of the first electrode, the second electrode, the first body, the second body, and the first organic layer.

7. The luminescent display panel of claim 6, wherein the inorganic insulation layer covers both a side of the first body and a side of the second body.

8. The luminescent display panel of claim 6, wherein the inorganic insulation layer is formed by using a chemical vapor deposition (CVD) method.

9. The luminescent display panel of claim 1, wherein the first organic layer and the second organic layer include a same material.

* * * * *